(12) United States Patent
Hsieh et al.

(10) Patent No.: US 7,454,119 B2
(45) Date of Patent: Nov. 18, 2008

(54) ILLUMINATION PACKAGE

(75) Inventors: Min-Hsun Hsieh, Hsinchu (TW);
Chou-Chih Yin, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 11/598,839

(22) Filed: Nov. 14, 2006

(65) Prior Publication Data

US 2007/0104963 A1    May 10, 2007

Related U.S. Application Data

(63) Continuation-in-part of application No. 11/233,030, filed on Sep. 23, 2005, now Pat. No. 7,142,769.

(30) Foreign Application Priority Data

Sep. 24, 2004 (TW) ............... 93129157 A
May 6, 2005 (TW) ............... 94114630 A

(51) Int. Cl.
*G02B 6/10* (2006.01)
(52) U.S. Cl. .................................... 385/146
(58) Field of Classification Search .................. 385/146
See application file for complete search history.

(56) References Cited

U.S. PATENT DOCUMENTS

| | | | |
|---|---|---|---|
| 5,404,869 A * | 4/1995 | Parkyn et al. ............... | 126/699 |
| 6,582,103 B1 * | 6/2003 | Popovich et al. ............ | 362/307 |
| 6,598,998 B2 | 7/2003 | West et al. | |
| 6,607,286 B2 | 8/2003 | West et al. | |
| 6,679,621 B2 * | 1/2004 | West et al. .................. | 362/327 |
| 6,974,229 B2 * | 12/2005 | West et al. .................. | 362/227 |
| 7,034,343 B1 * | 4/2006 | Kim et al. .................... | 257/98 |
| 2004/0070855 A1 * | 4/2004 | Benitez et al. .............. | 359/858 |
| 2004/0207999 A1 * | 10/2004 | Suehiro et al. ............... | 362/84 |
| 2004/0218390 A1 * | 11/2004 | Holman et al. .............. | 362/245 |
| 2005/0024744 A1 * | 2/2005 | Falicoff et al. .............. | 359/737 |

* cited by examiner

*Primary Examiner*—Michelle R. Connelly-Cushwa
*Assistant Examiner*—Chris Chu
(74) *Attorney, Agent, or Firm*—Rabin & Berdo, PC

(57) ABSTRACT

An illumination package is disclosed in the invention. The illumination package includes an optical element, package base, and a light emitter. The optical element is designed to redirect a majority of light emitted from the light emitter to a direction approximately perpendicular to a longitudinal axis of the optical element. In one embodiment, the optical element includes an flared portion and a base portion. The flared portion is constructed by an upper surface forming a recess, a side surface adjacent to the upper surface and curved, and a lower surface connecting to the base portion. In another embodiment, a concave lens is formed on the upper surface.

19 Claims, 8 Drawing Sheets

ILLUMINATION PACKAGE

RELATED APPLICATIONS

This application is a continuation-in-part of Ser. No. 11/233,030 filed Sep. 23, 2005 now U.S. Pat. No. 7,142,769, which claims priority to Taiwan applications No. 093129157, filed Sep. 24, 2004 and No. 094114630, filed May 6, 2005, the disclosures of which are incorporated herein by reference in their entirety.

BACKGROUND OF THE INVENTION

1. Field of the Invention

The present invention relates to a illumination package, and more particularly to a light emitter coupled with an optical lens able to redirect light to a direction approximately perpendicular to the longitudinal axis passing through a horizontal surface of the illumination package.

2. Description of the Related Art

FIG. 1 illustrates a conventional Light Emitting Diode (LED) package 10 that includes an optical lens 11, a package base 12, and a LED chip 13. The LED package 10 has a longitudinal axis 15 passing through the center of the optical lens 11. The LED chip 13 is positioned on the package base 12. The package base 12 may have a cup (not shown) with a reflector (not shown) to reflect light emitted from the bottom and sides of the LED chip 13 towards the observer.

The optical lens 11 is coupled to the LED chip 13 to receive and redirect light emitted from the LED chip 13. The optical lens 11 may have a recess 14 to adapt the LED chip 13. The light entering through the recess 14 of the optical lens 11 may travel in two main light paths. The first light path LP1 is that the light emitted from the LED chip 13 travels to the surface 1102 and be total-internal-reflected to exit through sidewall 1101 at approximately 90 degree to the longitudinal axis 15. The second light path LP2 is that the light emitted from the LED chip 13 travels towards the sidewall 1101 at an angel causing total internal reflection or a reflection from the sidewall 1101 to exit the optical lens 11 at an angle not close to perpendicular to the longitudinal axis 15. The first light path LP1 is preferable to generate an efficient side emitting light, while the second light path LP2 may cause a light spot, which is not desirable with the observer.

A need exists for an LED package or illumination device to reduce its entire size by coupling a shallow optical lens and avoid light spots suffered by the observer. A need also exists for an LED package or illumination device to provide uniform colored light.

BRIEF SUMMARY OF THE INVENTION

In accordance with one embodiment of the invention, an illumination package includes an optical element, a package base, and a light emitter. The light emitter is disposed on a surface of the package base. The optical element is attached to the package base and/or light emitter. The optical element has a flared portion and a base portion. The flared portion is formed by an upper surface, a side surface, and a lower surface. The upper surface forms a recess of the flared portion. The side surface is adjacent to upper surface and obliquely angled with respect to a longitudinal axis approximately normal to a horizontal surface of the base portion. Besides, the side surface is curved, and preferably is formed as a concaved surface. The lower surface is adjacent to the side surface and connecting to the base portion. The optical element may be radially symmetric about the longitudinal axis.

In another embodiment of the invention, an optical element, comprised of a light-pervious material, comprises a base portion having a terrace; a flared portion protruding from said base portion and constructed from an upper surface forming a recess and having a proximal end and a distal end, a side surface, and a lower surface; and wherein said upper surface is substantially parallel to or departs far from said lower surface along a path from said proximal end to said distal end.

In accordance with another embodiment of the invention, the optical element is formed in a longitudinal direction, preferably, is bilaterally symmetric about a longitudinal plane passing through the optical element. Furthermore, a convex lens is formed on the upper surface. Specifically, the upper surface is formed as a ripply surface. The propagation direction of the ripples formed on the upper surface may be parallel to the longitudinal direction. The radius of the convex lens is about between 50-60 μm. The light emitter is preferably arranged along the propagation direction.

DETAILED DESCRIPTION OF THE INVENTION

Figure 1:
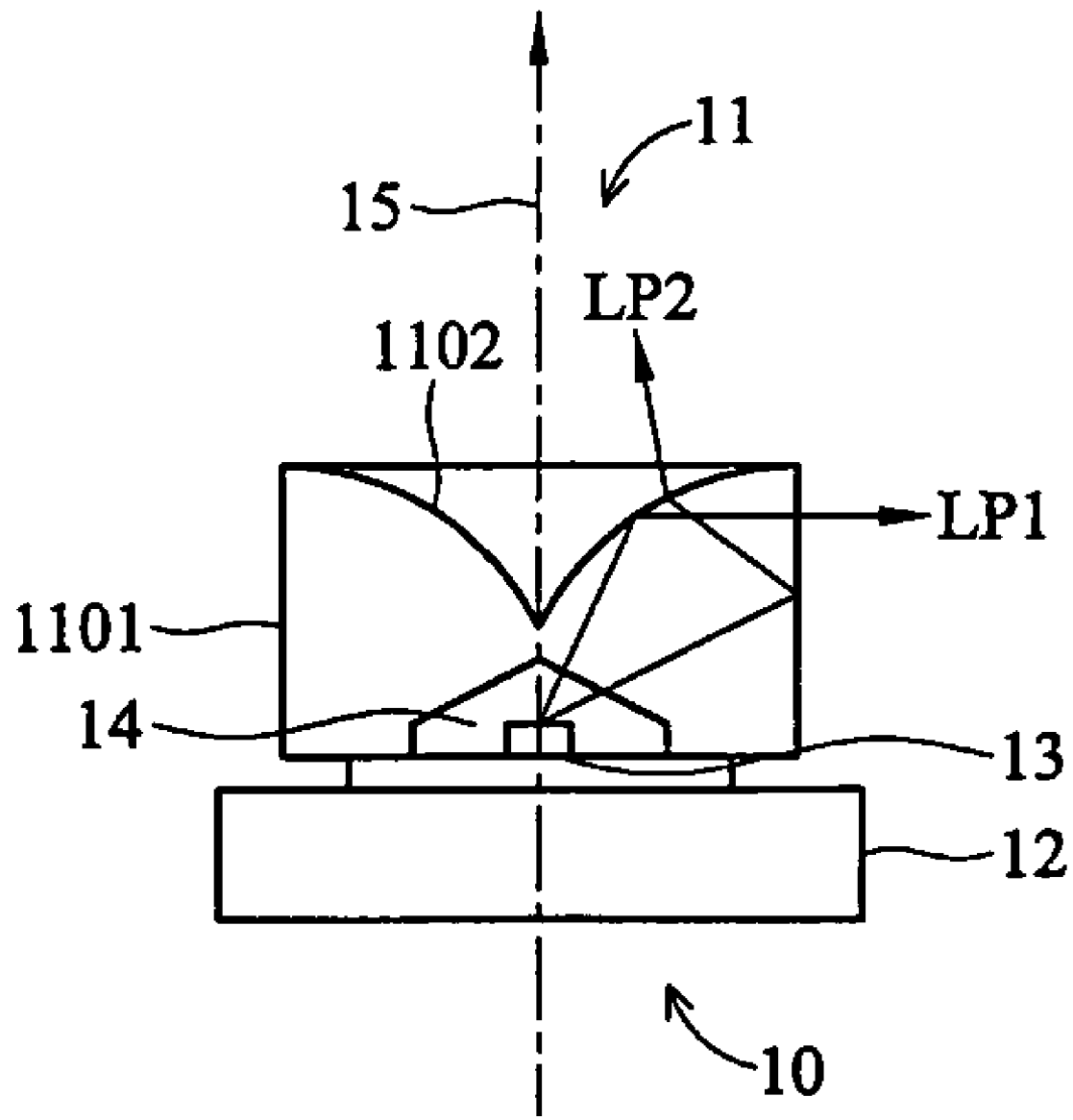
FIG. 1 illustrates a conventional LED package.
Figure 2A:
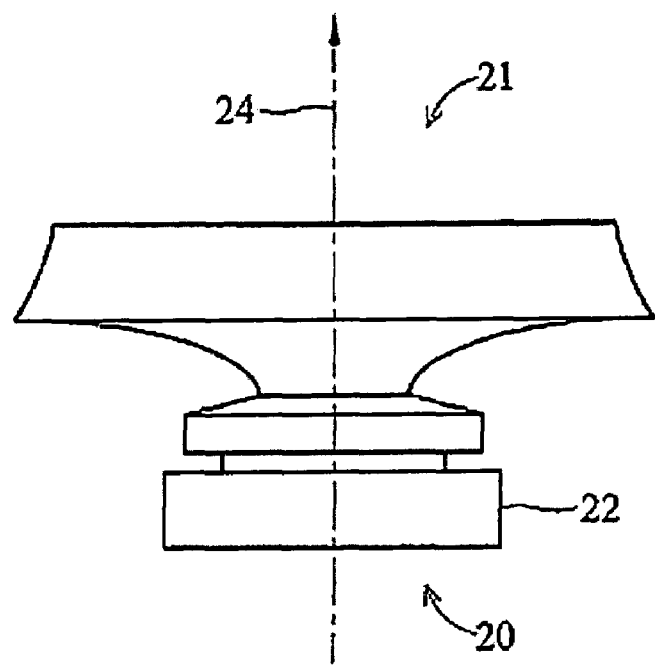
FIG. 2A illustrates one embodiment of the invention.

FIG. 2A illustrates an example of an illumination package 20 in accordance with one embodiment of the invention. The illumination package 20 includes an optical element 21, a package base 22 and a longitudinal axis 24. The optical element 21, such as a lens, is coupled to the package base 22 for redirecting light entering thereinto. The longitudinal axis 24 may pass through the center of the optical element 21 or not, and, preferably, be approximately perpendicular to a horizontal surface of the package base 22.

Figure 2B:
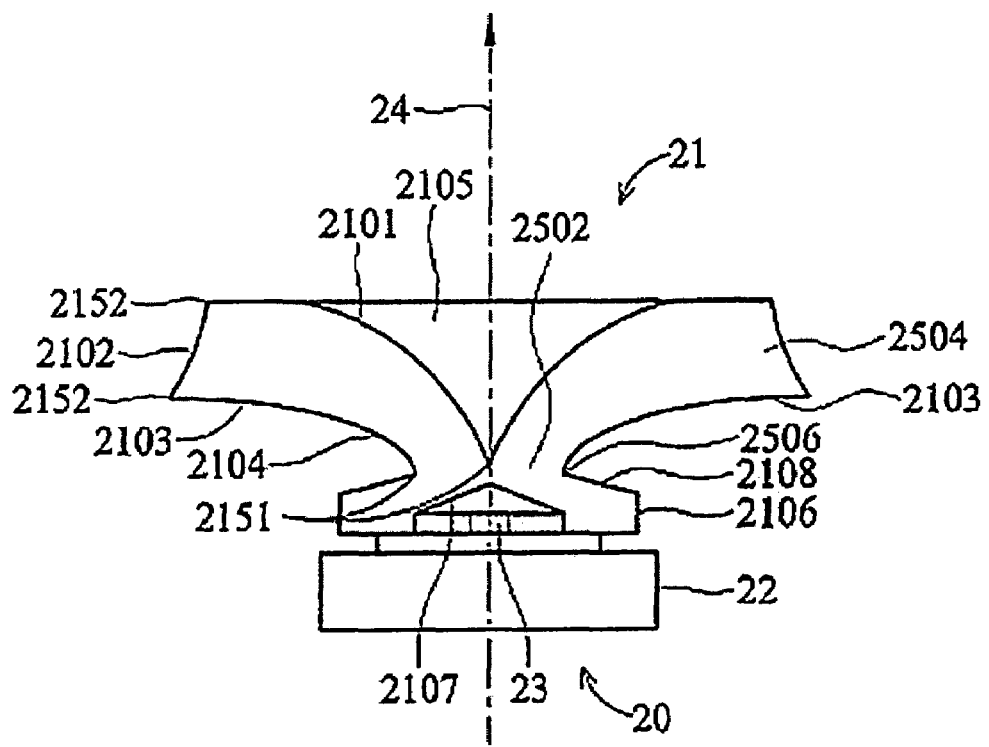
FIG. 2B illustrates a cross sectional view of an illumination package of FIG. 2A.
Figure 2C:
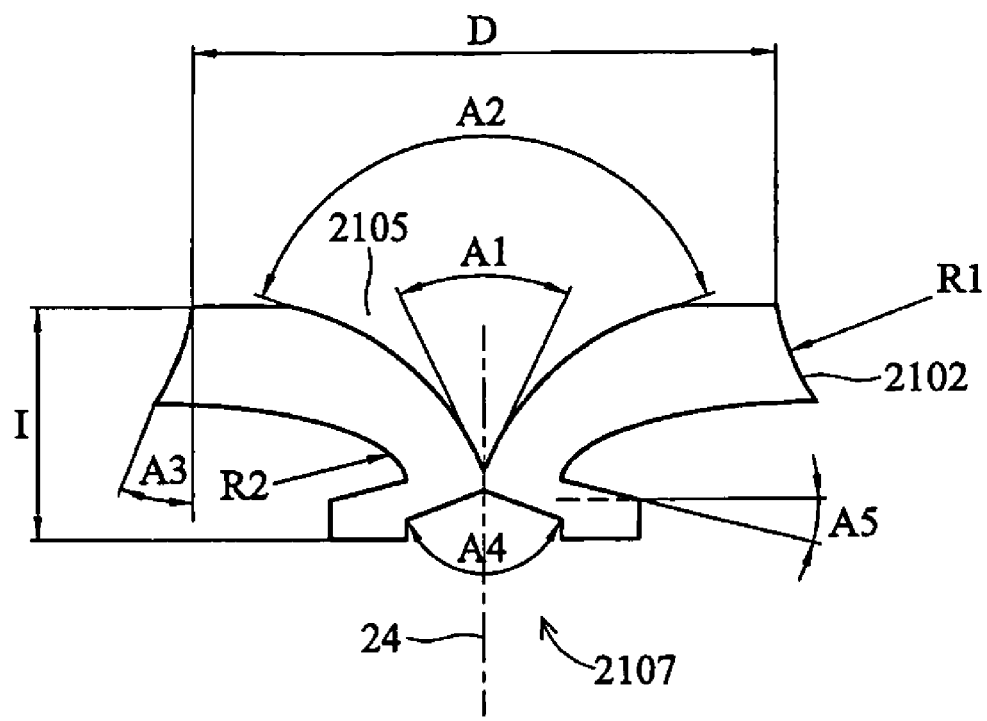
FIG. 2C illustrates a cross sectional view of an optical element coupling to the illumination package of FIG. 2A.

FIG. 2B illustrates a cross sectional view of the illumination package 20 of FIG. 2A. Light emitter 23 is disposed on a surface of the package base 22. The light emitter 23 includes but not limited to an LED chip, laser diode, an incandescent lamp, a fluorescent tube, a Cold Cathode Fluorescent Lamp, and any other device able to emit light and be coupled to the optical element 21.

The optical element 21 may be a separate component and attached to the package base 22 by various means including but not limited to screw fixing, snap fitting, friction fitting, adhesive bonding, heat stacking, and ultra-sonic welding. Alternatively, the optical element 21 may be formed onto the package base 22 and/or the light emitter 23 by various means including but not limited to injection molding and casting.

The optical element 21 is made of a light-pervious material. The light-pervious material may be a transparent material or an opaque material being totally or partially pervious to light emitted from the light emitter 23. The light-pervious material includes but not limited to acrylic resin, COC, PMMA, PC, PC/PMMA, Polyetherimide (PEI), fluorocarbon polymer, and silicone. The light-pervious material may be colored to make the optical element 21 acts as a filter in order to generate desired colored light.

If the illumination package 20 is positioned in an environment filled with air having a refractive index of one, the refractive index of the optical element 21 has to range between 1.4 to 1.8 in order to create the desired field of illumination in the invention. The refractive index of the optical element 21 may be a number other than above range based on the environment where the illumination package 20 resides or be used. Preferably, the difference of the refractive index between the optical element 21 and the environment where it exists is between 0.45 to 0.5.

As shown in FIG. 2B, the optical element 21 includes a flared portion and a base portion 2106. The flared portion has an upper surface 2101 forming a recess 2105 in the light-pervious material, a side surface 2102 adjacent to the upper surface 2101, and a lower surface 2103 adjacent to the side surface 2102. The base portion 2106 is designed to receive light from the light emitter 23 and may have a cavity 2107 for accommodating the light emitter 23. The optical element 21 is designed to redirect the majority of light from the light emitter 23 to exit the optical element 21 at the direction approximately normal to the longitudinal axis 24 or the direction not directly pointing to the observer. Furthermore, to avoid a dark spot appearing above the optical element 21, the minority of light from the light emitter 23 may be directed to the direction approximately parallel to the longitudinal axis 24 or the direction pointing to the observer.

The recess 2105 is designed to form the upper surface 2101. Preferably, the recess 2105 may have an apex, where the upper surface 2101 sinks, pointing to the light emitter 23. The apex may be passed by the longitudinal axis 24 or not. A reflective material or structure may be formed on the recess 2105 to totally or partially reflect light traveling to the upper surface 2101. The reflective material or structure includes but not limited to Ag, Al, Cu, Au, Cr, reflective paint, and Distributed Bragg Reflector (DBR). An ultraviolet resistant material may also be formed on the recess 2105 to prevent the package's components, especially those sensitive to ultraviolet, from degradation in the presence of ultraviolet.

The upper surface 2101 is designed as a total internal reflection (TIR) surface to reflect light entering from the base portion 2106 and prevent it from exiting through the recess 2105, but some light may still pass through the upper surface 2105 at certain incident angle varying with the overall design of the illumination package 20. The upper surface 2101 may be a flat surface, a rough surface or a curved surface having a constant radius or more than one radius. Specifically, the curved surface may have a variable radius changing along the curved path of the upper surface 2101. Preferably, the radius distant from the apex is larger than that near the apex.

The side surface 2102 is designed to be adjacent to the upper surface 2101 and obliquely angled with respect to the longitudinal axis 24 for directing light to the side of the optical element 21, specifically, to the direction approximately normal to the longitudinal axis 24. If the angle between the normal vector of the side surface 2102 and the longitudinal axis 24 is about 90 degree, a high percentage of light exiting through the side surface 2102 will travel downward. On the other hand, if the side surface 2102 is obliquely angled with respect, to the longitudinal axis 24 and preferably faces upward, as shown in FIG. 2B, less light will travel downward. The side surface 2102 can be formed in a flat plane, a rough or curved surface. The curved surface can be a concave, a convex, or both. A concave side surface will diverge the light passing through it, while a convex side surface will converge the light passing through it. A rough side surface may scatter light.

The lower surface 2103 is designed to be adjacent to the side surface 2102 and connect to the base portion 2106. The upper surface 2101, the side surface 2102, and the lower surface 2103 form a flared portion above the base portion 2106. The lower surface 2103 may be a flat plane, a rough surface, or a curved surface.

A concaved surface 2104 can be formed between the lower surface 2103 and the base portion 2106. Light emitted from the light emitter 23 and falling on the concaved surface 2104 may be reflected to the area of the recess 2105 and thus increase the amount of light exiting through the recess 2105. In that case, the observer may not easily detect a dark spot appearing above the recess 2105 of the optical element 21 of the illumination package 20.

A concaved surface 2104 can be formed between the lower surface 2103 and the base portion 2106. Light emitted from the light emitter 23 and falling on the concaved surface 2104 may be reflected to the area of the recess 2105 and thus increase the amount of light exiting through the recess 2105. In that case, the observer may not easily detect a dark spot appearing above the recess 2105 of the optical element 21 of the illumination package 20. The flared portion has a proximal end 2502 and a distal end 2504, and one end 2506 of the lower surface 2103 of the flared portion neighbors the proximal end 2502 of the flared portion.

A cavity 2107 can be formed in the base portion 2106 to accommodate the light emitter 23. The cavity 2107 has a volume preferably forming as a cone. The invention is not limited thereto. As shown in FIG. 2E, the cavity 2107 can have a volume forming a pyramid. Further, as shown in FIG. 2F, the cavity 2107 can have a volume forming a hemisphere. The apex of cone or pyramid, or the top of the hemisphere may point to the apex of the recess 2105. The terrace 2108 of the base portion 2106 may be formed as a horizontal plane, a curved surface or an incline. Light passing through the incline sloping at a certain angle may be refracted and move substantially perpendicular to the longitudinal axis 24.

Figure 2D:
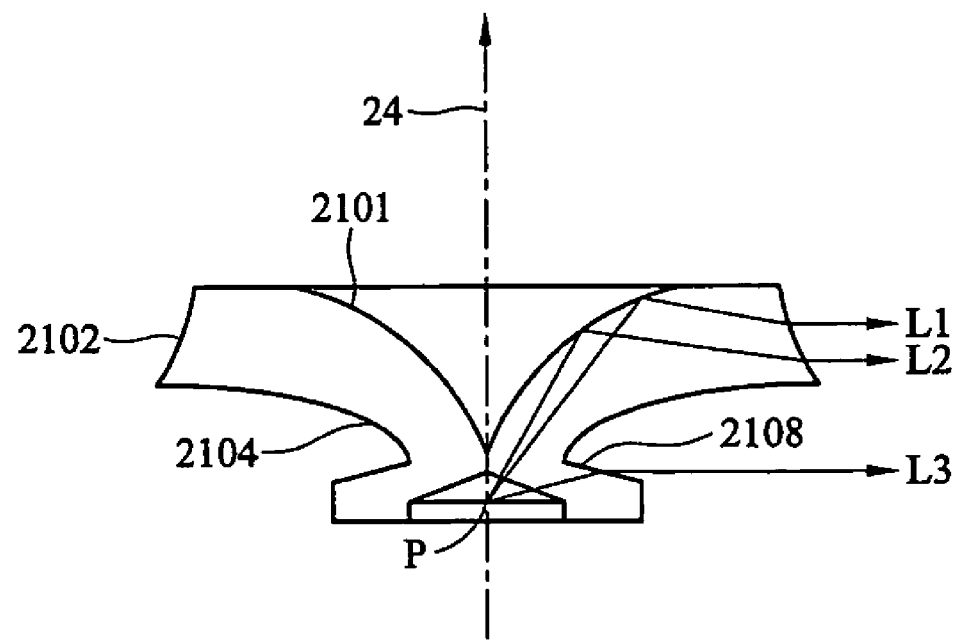
FIG. 2D illustrates ray-traces of one embodiment of the optical element.
Figure 2E:
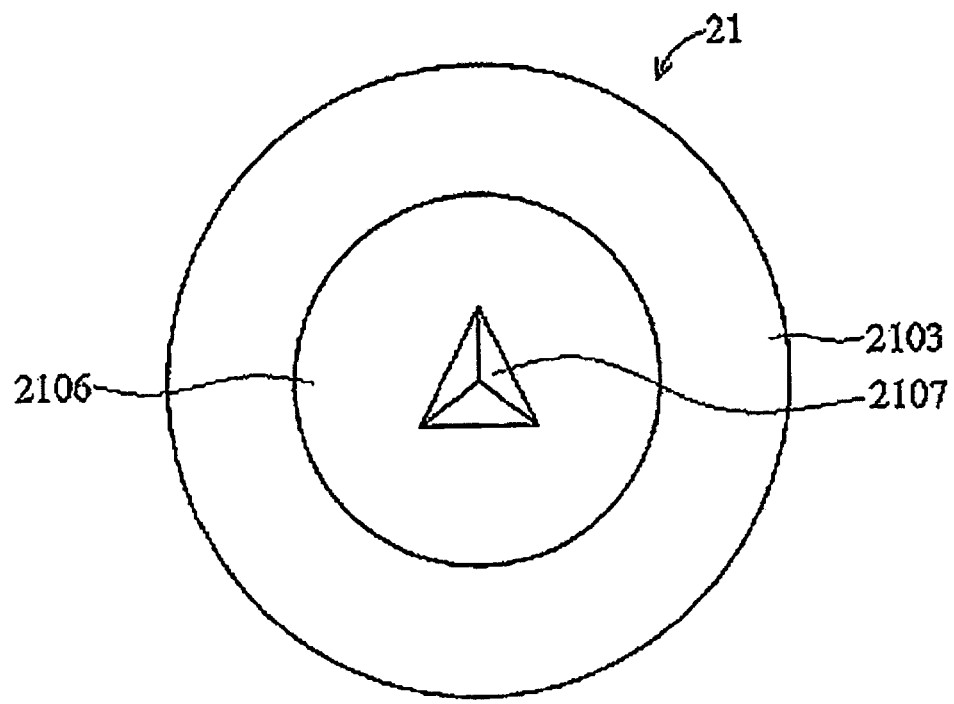
FIG. 2E illustrates a bottom view of an illumination package of another embodiment of the invention.
Figure 2F:
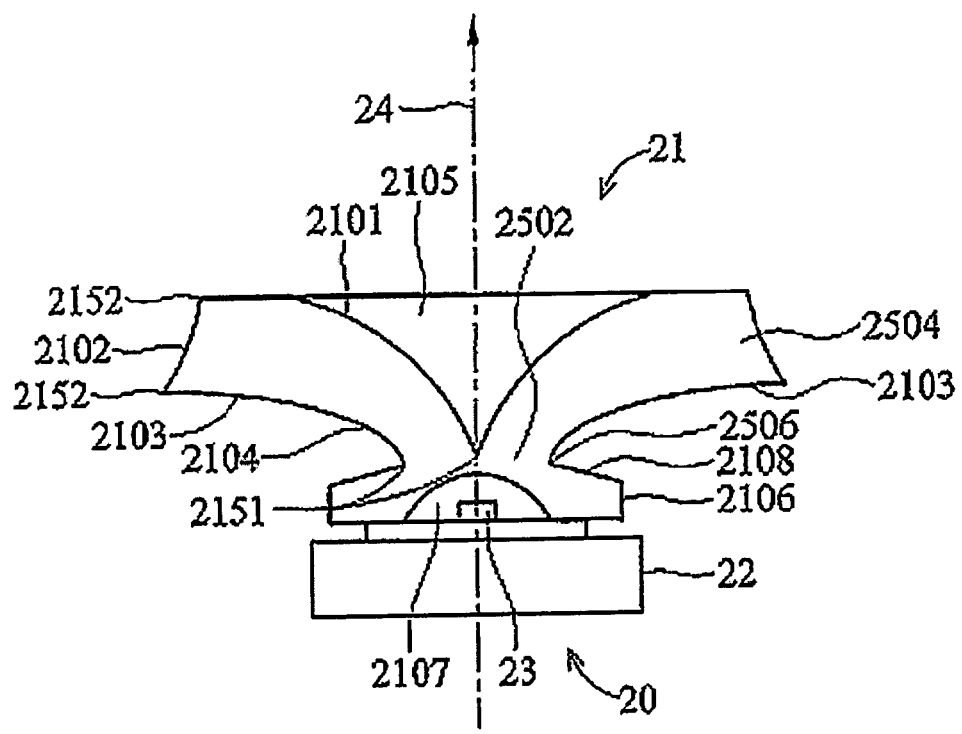
FIG. 2F illustrates a cross sectional view of an illumination package of embodiment of the invention.

FIG. 2D illustrates ray traces of light through the optical element 21 from an emitting point P inside the base portion. The light trace L1 emitted from the point P and incident on the upper surface 2101 is bent to reach lower surface 2103 or leave optical element 21 for one or more times total internal reflections, and horizontally exits the optical element 21 for the refraction caused by the curved side surface 2102. The light trace L2 emitted from the point P and bent on the concaved surface 2104 to the upper surface 2101 is redirected twice for total internal reflection and horizontally exits the optical element 21 for the refraction caused by the curved side surface 2102. The light trace L3 emitted from the point P and incident on the inclined surface of the terrace 2108 is refracted off and horizontally exits out the optical element 21.

The shape of optical element 21 from top view may be an ellipse, a circle, or a rectangle. If the optical element 21 is radially symmetric about the longitudinal axis 24 passing through the center of the optical element 21, the shape of optical element 21 from top view is a circle. In the case, the longitudinal axis 24 may also pass through the apex of the recess 2105. If the optical element 21 is bilateral symmetric about a central plane dividing the optical element 21 into two identical parts, the shape of optical element 21 from top view can be an ellipse, a circle, or a rectangle. In the case, the longitudinal axis 24 resides on the central plane and may pass through the apex of the recess 2105.

Figure 3A:
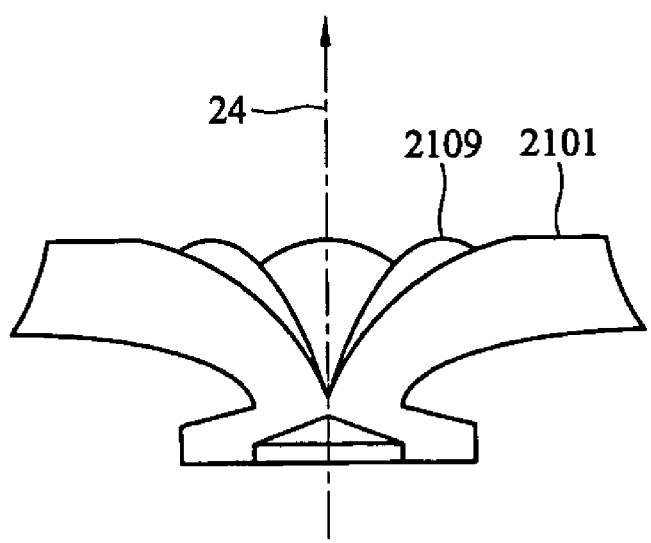
FIG. 3A illustrates a cross sectional view of an illumination package in accordance with another embodiment of the invention.
Figure 3B:
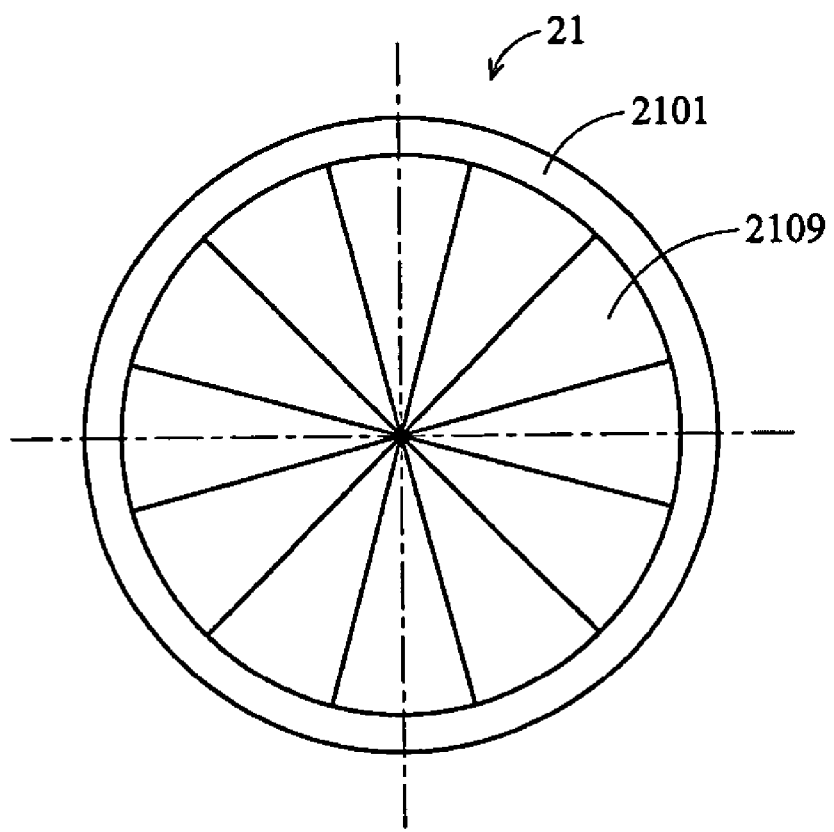
FIG. 3B illustrates a top view of the illumination package of FIG. 3A.
Figure 3C:
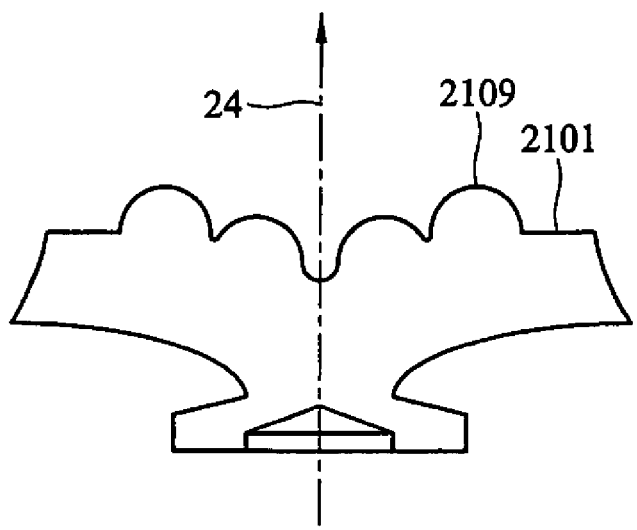
FIG. 3C illustrates a cross sectional view of an illumination package in accordance with another embodiment of the invention.
Figure 3D:
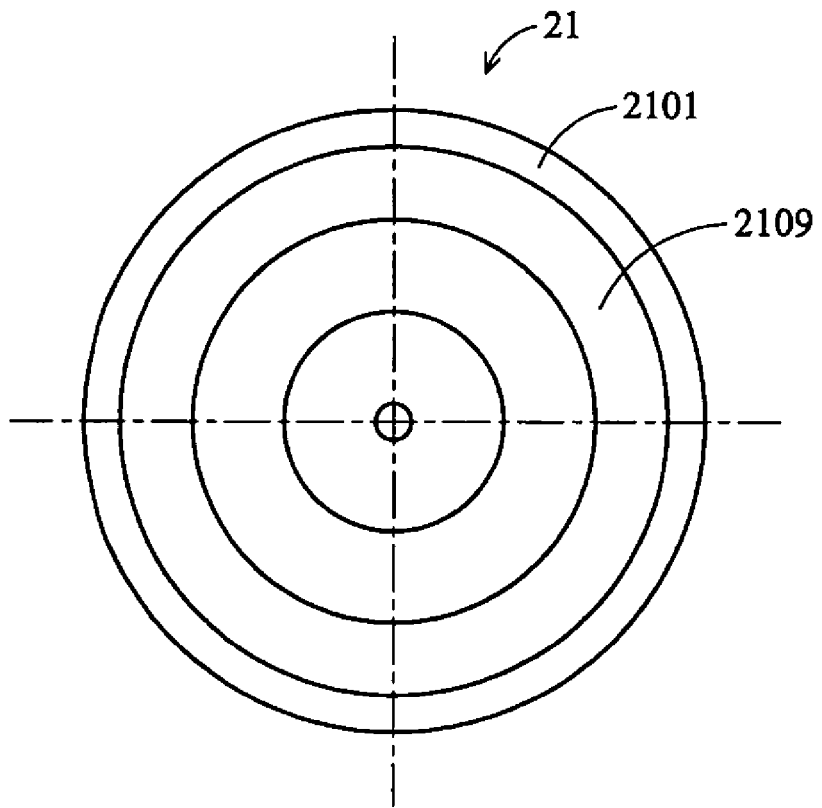
FIG. 3D illustrates a top view of the illumination package of FIG. 3C.

FIGS. 3A.about.3D illustrate the optical elements 21 in accordance with another embodiment of the invention. In this embodiment, the upper surface 2101 of the optical element 21 is formed as a ripply surface. The ripple 2109 of the upper surface 2101 may sweep about the longitudinal axis 24, as shown in FIG. 3A, or move radially outward from the deepest portion of the recess 2105, as shown in FIG. 3C. FIGS. 3B and 3D are the top views of the two types of the ripply surfaces respectively. The ripples 2109 can be formed as a plurality of convex lenses. The radius of the convex lens may be varied about between 50-60 μm.

Figure 4:
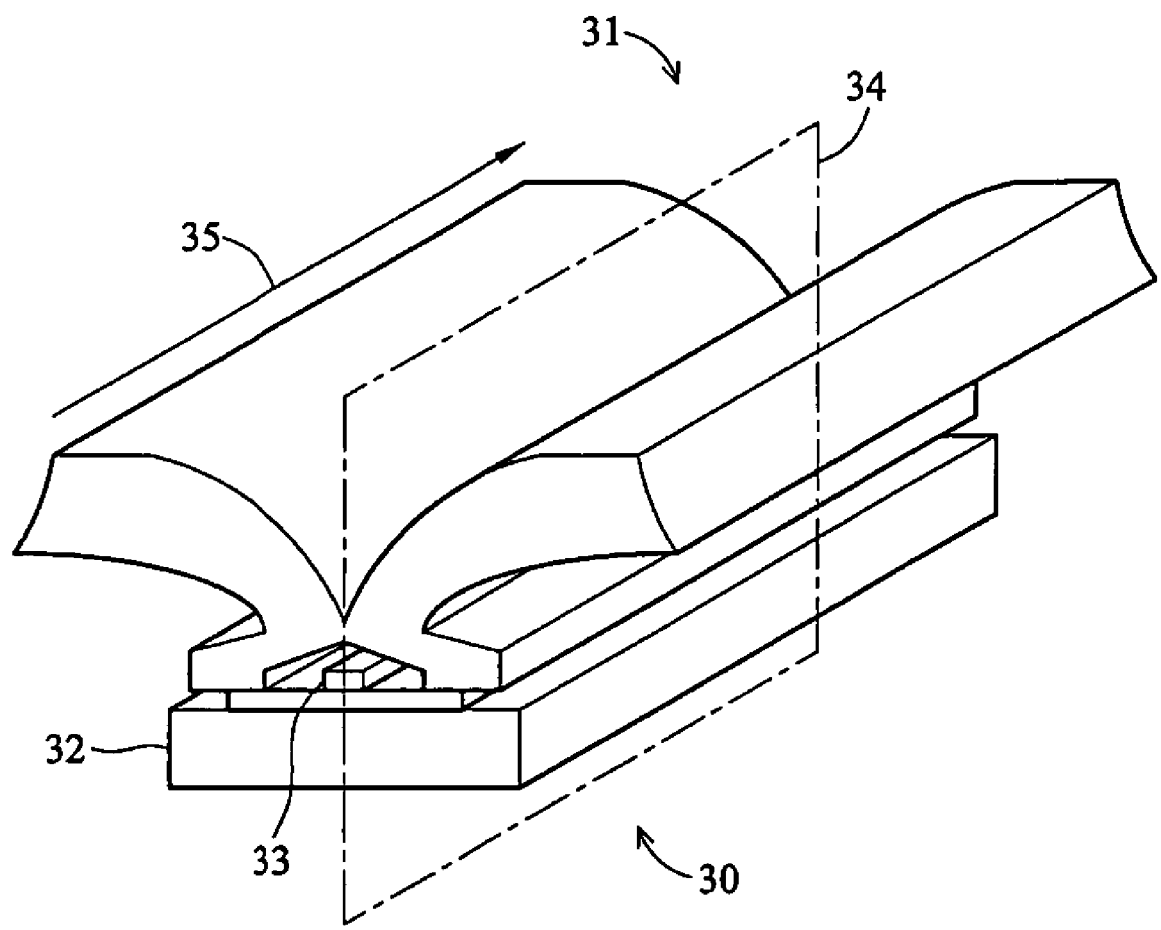
FIG. 4 illustrates a perspective view of further embodiment of the invention.

FIG. 4 illustrates a perspective view of further embodiment of the invention. The illumination package 30 of this embodiment includes an optical element 31, a package base 32, light emitter 33, and a longitudinal plane 34. The optical element 31 has a cross section similar to that of the optical element 21 illustrated above. The difference between the optical elements 31 and 21 is that the optical element 31 is formed in a longitudinal direction 35 and passed by a longitudinal plane 34. The longitudinal direction 35 is normal to the cross section of the optical element 31. The longitudinal plane 34 may pass through the centerline of the optical element 31 or not, and, preferably, be approximately perpendicular to a horizontal surface of the package base 32.

Figure 5A:
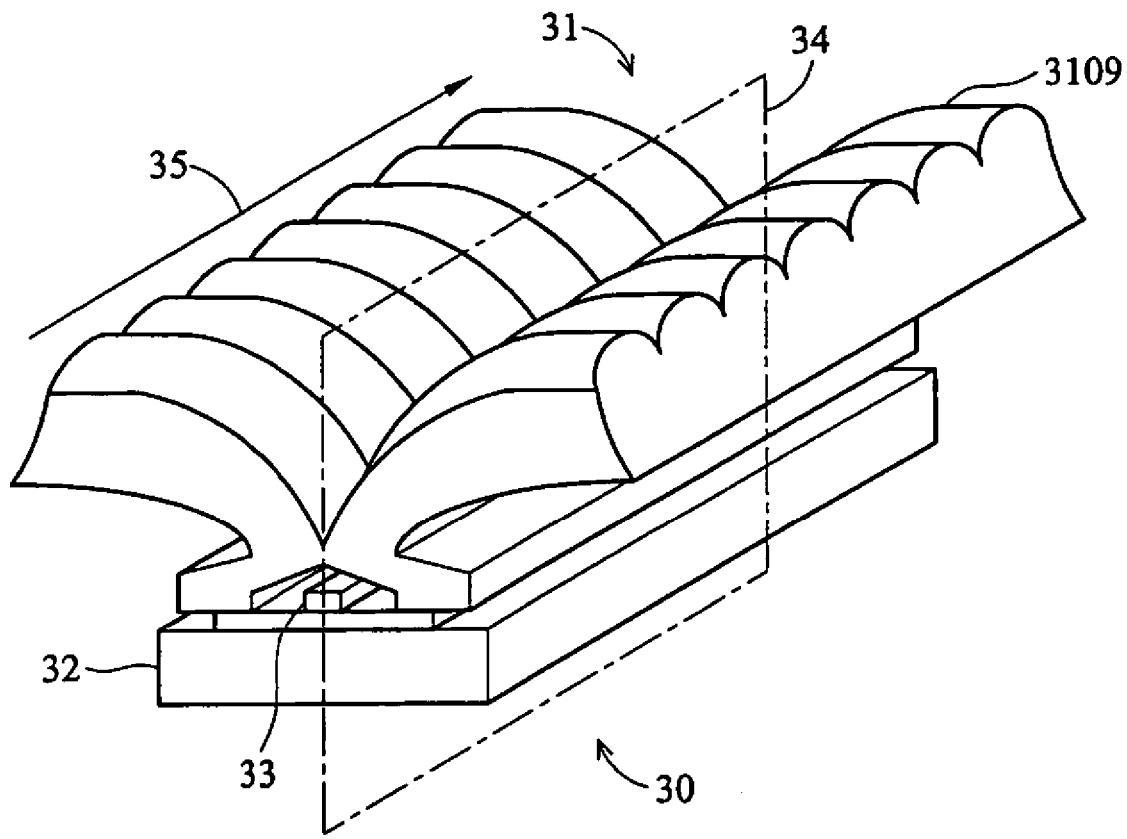
FIG. 5A illustrates a perspective view of another further embodiment of the invention.
Figure 5B:
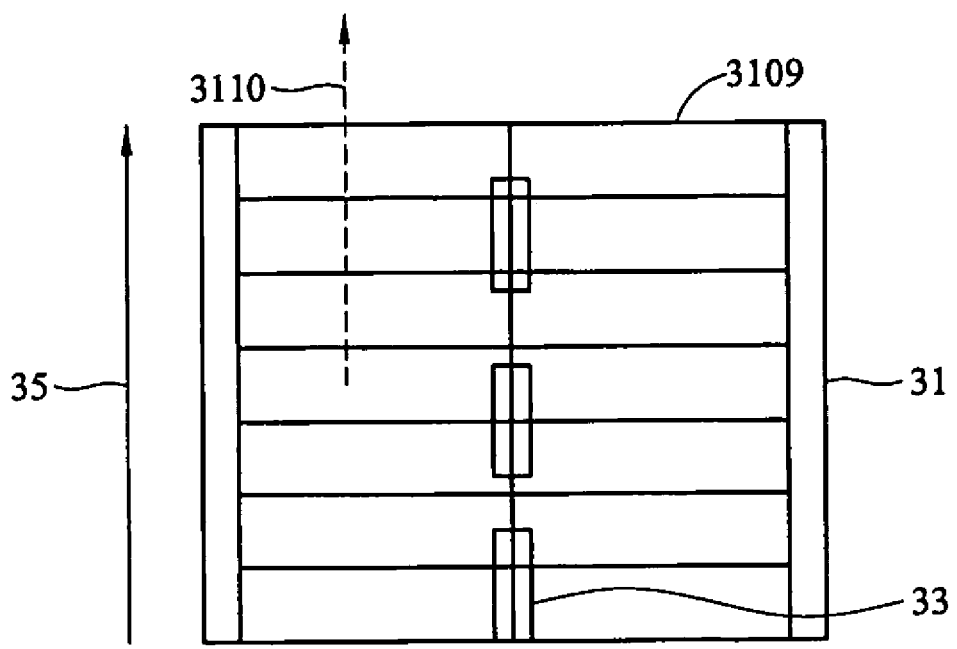
FIG. 5B illustrates a top view of an illumination package of FIG. 5A.

FIG. 5A illustrates a perspective view of an illumination package with a ripply upper surface in accordance with an embodiment of the invention. FIG. 5B illustrates the top view of the illumination package of FIG. 5A. As shown in FIG. 5A, the illumination package 31 has components similar to those in FIG. 4 except the ripples 3109 formed on the upper surface of the optical element 31. As shown in FIG. 5B, the ripples 3109 run along a propagation direction 3110. The propagation direction 3110 is the direction where the ripples move, and preferably parallels or approximately parallels to the longitudinal direction 35, but other direction is also accepted. The light emitter 33 may be disposed below the optical element 31, and preferably arranged in a direction parallel to the propagation direction 3110.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An optical element comprised of a light-pervious material, comprising:
   a base portion having a terrace;
   a flared portion protruding from said base portion and constructed from an upper surface forming a recess and having a proximal end and a distal end, a side surface, and a lower surface; and
   wherein said upper surface is substantially parallel to or departs far from said lower surface along a path from said proximal end to said distal end, one end of the lower surface of the flared portion neighbors the proximal end of the flared portion, and said upper surface and said lower surface are curved to the same direction.

2. The optical element of claim 1, wherein said upper surface is selected from the group consisting of a flat plane, a rough surface, a curved surface, and any combination thereof.

3. The optical element of claim 1, wherein said side surface is selected from the group consisting of a flat plane, a rough surface, a curved surface, and any combination thereof.

4. The optical element of claim 1, wherein said lower surface is selected from the group consisting of a flat plane, a rough surface, a curved surface, and any combination thereof.

5. The optical element of claim 1, further comprising:
   a concaved surface connecting to said lower surface and said base portion.

6. The optical element of claim 1, wherein said terrace comprises an exposed surface selected from the group consisting of a horizontal plane, a curved surface, an incline, and any combination thereof.

7. The optical element of claim 1, wherein said flared portion is radially symmetric about a longitudinal axis passing through said optical element.

8. The optical element of claim 1, wherein said flared portion is bilaterally symmetric about a longitudinal plane passing through said optical element.

9. The optical element of claim 1, further comprising:
   a cavity formed on a side different from that of said recess on said base portion.

10. The optical element of claim 9, wherein said cavity has a shape selected from the group consisting of a cone, a pyramid, and a hemisphere.

11. The optical element of claim 1, further comprising:
    a package base for supporting at least one of said base portion and said flared portion.

12. The optical element of claim 11, wherein at least one of said base portion and said flared portion is attached to said package portion by a means selected from the group consisting of screwing, snap fitting, friction fitting, adhesive bonding, heat stacking, ultra-sonic welding, and any combination thereof.

13. The optical element of claim 1, wherein said base portion is adapted to receiving light from a light emitter.

14. The optical element of claim 13, wherein said light emitter is selected from the group consisting of a light-emitting diode, a laser diode, an incandescent lamp, a fluorescent tube, and a cold cathode fluorescent lamp.

15. The optical element of claim 13, wherein a part of light from said light emitter is refracted out of said optical element through said terrace.

16. The optical element of claim 13, wherein a part of light from said light emitter is guided out of said optical element via reflecting between said upper surface and said lower surface.

17. The optical element of claim 13, wherein a part of light from said light emitter passes through said recess.

18. An optical element comprised of a light-pervious material, comprising:
    a base portion having a terrace;
    a flared portion protruding from said base portion and constructed from an upper surface forming a recess and having a proximal end and a distal end, a side surface, and a lower surface; and
    wherein said upper surface is substantially parallel to or departs far from said lower surface along a oath from said proximal end to said distal end, one end of the lower surface of the flared portion neighbors the proximal end of the flared portion, and said side surface is substantially faced upward.

19. An optical element comprised of a light-pervious material, comprising:
 a base portion having a terrace;
 a flared portion protruding from said base portion and constructed from an upper surface forming a recess and having a proximal end and a distal end, a side surface, and a lower surface; and wherein said upper surface is substantially parallel to or departs far from said lower surface along a path from said proximal end to said distal end, one end of the lower surface of the flared portion neighbors the proximal end of the flared portion, and said side surface is obliquely angled with respect to a longitudinal axis substantially perpendicular to a bottom surface of said base portion.

* * * * *